(12) United States Patent
Thebault et al.

(10) Patent No.: US 8,084,079 B2
(45) Date of Patent: Dec. 27, 2011

(54) METHOD FOR CHEMICAL INFILTRATION IN THE GAS PHASE FOR THE DENSIFICATION OF POROUS SUBSTRATES WITH PYROLYTIC CARBON

(75) Inventors: Jacques Thebault, Bordeaux (FR); Sébastien Bertrand, Moulis en Medoc (FR); Christian Robin-Brosse, Le Haillan (FR); Bruno Bernard, Pessac (FR); Jean-Luc Domblides, Bruges (FR)

(73) Assignee: Snecma Propulsion Solide, Le Haillan (FR)

( * ) Notice: Subject to any disclaimer, the term of this patent is extended or adjusted under 35 U.S.C. 154(b) by 968 days.

(21) Appl. No.: 11/795,938

(22) PCT Filed: Jan. 23, 2006

(86) PCT No.: PCT/FR2006/050037
§ 371 (c)(1),
(2), (4) Date: Mar. 3, 2008

(87) PCT Pub. No.: WO2006/077353
PCT Pub. Date: Jul. 27, 2006

(65) Prior Publication Data
US 2008/0160192 A1 Jul. 3, 2008

(30) Foreign Application Priority Data

Jan. 24, 2005 (FR) .................................. 05 00696

(51) Int. Cl.
*C23C 16/26* (2006.01)
*C23C 16/52* (2006.01)

(52) U.S. Cl. .................... 427/8; 427/249.2; 427/255.12; 427/900

(58) Field of Classification Search ............... 427/249.2, 427/249.15, 900, 8, 255.12
See application file for complete search history.

(56) References Cited

U.S. PATENT DOCUMENTS

| 5,348,774 A | 9/1994 | Golecki et al. |
| 5,789,026 A | 8/1998 | Delperier et al. |
| 5,837,081 A * | 11/1998 | Ting et al. ................. 156/89.26 |

(Continued)

FOREIGN PATENT DOCUMENTS

FR  2 832 936  6/2003

(Continued)

OTHER PUBLICATIONS

McAllister, P., et al., "Simulation of a Multiple Substrate Reactor for Chemical Vapor Infiltration of Pyrolytic Carbon within Carbon-Carbon Composites". AlChE Journal, Jul. 1993 vol. 39, No. 7 pp. 1196-1209.*

(Continued)

*Primary Examiner* — Bret Chen
(74) *Attorney, Agent, or Firm* — Weingarten, Schurgin, Gagnebin & Lebovici LLP

(57) ABSTRACT

A method of densifying a porous substrate with pyrolytic carbon includes loading the substrate into an oven, admitting a reaction gas mixture to the oven, extracting an effluent gas from the oven, and recycling components of the effluent gas into the reaction gas mixture. The reaction gas mixture contains a pyrolytic carbon precursor gas together with a vector gas. The effluent gas contains residual components of the reaction gas mixture together with reaction products, including hydrogen. The recycling is performed after eliminating heavy hydrocarbons contained in the effluent gas.

19 Claims, 3 Drawing Sheets

U.S. PATENT DOCUMENTS

| | | | |
|---|---|---|---|
| 5,904,957 A * | 5/1999 | Christin et al. | 427/248.1 |
| 6,197,374 B1 * | 3/2001 | Huttinger et al. | 427/249.2 |
| 6,849,105 B2 | 2/2005 | Baudry et al. | |
| 6,942,893 B2 * | 9/2005 | Delperier et al. | 427/237 |
| 6,953,605 B2 * | 10/2005 | Sion et al. | 427/248.1 |
| 7,241,470 B2 | 7/2007 | Delperier et al. | |
| 2003/0101869 A1 | 6/2003 | Baudry et al. | |
| 2004/0215043 A1 * | 10/2004 | Senetar | 585/639 |
| 2004/0237898 A1 * | 12/2004 | Bernard et al. | 118/724 |
| 2005/0163929 A1 * | 7/2005 | Delperier et al. | 427/249.1 |

FOREIGN PATENT DOCUMENTS

| | | |
|---|---|---|
| FR | 2 834 052 | 6/2003 |
| JP | 2000-169250 * | 6/2000 |
| WO | WO 96/15285 | 5/1996 |

OTHER PUBLICATIONS

Li, Hejun, et al., "Numerical simulation of chemical vapor infiltration of propylene into C/C composites with reduced multi-step kinetic models". Carbon 43 (2005) pp. 2937-2950.*

Wikipedia, "Carbon black," printed from website, last updated Oct. 24, 2010, pp. 1-5.

* cited by examiner ial phase filing of PCT/
METHOD FOR CHEMICAL INFILTRATION IN THE GAS PHASE FOR THE DENSIFICATION OF POROUS SUBSTRATES WITH PYROLYTIC CARBON This application is a §371 national phase filing of PCT/FR2006/050037 filed Jan. 23, 2006, and claims priority to French application No. 05 00696 filed Jan. 24, 2005.

BACKGROUND AND OBJECT OF THE INVENTION

The invention relates to densifying porous substrates with pyrolytic carbon (PyC) obtained by chemical vapor infiltration (CVI).

Densifying porous substrates by PyC-CVI is well known. In a commonly used method, substrates for densifying are loaded into an oven, and a reaction gas containing at least one PyC precursor reagent gas together with a vector gas is admitted into the oven. An effluent gas containing residual components of the reaction gas and reaction by-products is removed from the outlet of the oven. Operating conditions, in particular the temperature and pressure inside the oven, the content of precursor reagent gas in the reaction gas, and the transit time of the reaction gas through the oven, are selected so as to form the desired PyC deposit within the pores of the substrates.

The precursor reagent gas comprises at least one hydrocarbon of the $C_xH_y$ type, where x and y are natural integers and $x \geq 2$, e.g. propane $C_3H_8$ or butane $C_4H_{10}$, or indeed propylene $C_3H_6$. Its function is to be the main contributor to the PyC deposition reaction, and it is sometimes referred to as a dopant gas.

The vector gas has a dilution function encouraging the reaction gas to diffuse into the core of the pores of the substrates. It may be constituted by an inert gas such as nitrogen $N_2$, helium He, argon Ar, or indeed methane $CH_4$. Methane reacts little and acts more as a vector gas than as a PyC precursor gas.

It is also known from U.S. Pat. No. 5,789,026 to add hydrogen gas $H_2$ into the reaction gas in order to modulate deposition kinetics, where $H_2$ performs a slowing down function in a certain range of temperatures.

This function of $H_2$ in a PyC-CVI type densification process is also described in U.S. Pat. No. 6,197,374 which recommends using a gas made up of methane $CH_4$, and of hydrogen $H_2$, using pressures that are high relative to the usual pressures, and not using any vector gas or dilution gas. Recycling a stream of gas extracted from the effluent gas is envisaged, but hydrocarbon compounds heavier than methane are eliminated. The method described appears to be of an experimental rather than of an industrial type.

The possibility of recovering components from an effluent gas in a PyC-CVI densification process is mentioned in U.S. Pat. No. 5,348,774, whether for recycling or to produce energy, but without any other details on how the recycling might be implemented.

Known PyC-CVI type methods presently in use are expensive in terms of their consumption of the gases constituting the reaction gas, and also in terms of energy consumption.

It is therefore desirable to have a CVI method that enables a significant reduction to be achieved in the costs of densifying porous substrates with PyC.

SUMMARY OF THE INVENTION

This object is achieved by a chemical vapor infiltration method for densifying porous substrates with pyrolytic carbon, the method comprising the steps of:
  loading one or more porous substrates for densifying in an oven;
  admitting into the oven a reaction gas containing a pyrolytic carbon precursor reagent gas having at least one gaseous hydrocarbon $C_xH_y$ in which x and y are natural integers and x is such that $1<x<6$, together with a vector gas comprising at least one gas selected from methane and inert gases;
  extracting from the oven an effluent gas containing residual components of the admitted gas and reaction products, including hydrogen; and
  recycling at least a fraction of a gas stream extracted from the effluent gas and containing pyrolytic carbon precursor reagent gas into the reaction gas admitted into the oven, whereby at least a portion of the pyrolytic carbon precursor reagent gas contained in the reaction gas comes from the recycled gas stream.

The method may include the following steps:
  measuring at least the quantities of pyrolytic carbon precursor gas and of vector gas contained in the gas stream extracted from the effluent gas; and
  as a function of the measured quantities, controlling at least: the flow rate of said gas stream that is recycled in the reaction gas and that contains pyrocarbon precursor reagent gas and vector gas; the flow rate of precursor gas coming from an external source of pyrolytic carbon precursor gas and injected into the reaction gas; and the flow rate of vector gas coming from an external source of vector gas and injected into the reaction gas;
  in such a manner as to obtain a desired fraction of pyrolytic carbon precursor gas in the reaction gas admitted into the oven.

The method of the invention is thus remarkable in that at least a portion of the pyrolytic carbon precursor gas contained in the reaction gas comes from the recycled gas stream.

The precursor gas extracted from the effluent gas may be a residue of that present in the reaction gas admitted into the oven. It may also comprise reaction products produced in the oven.

It is then advantageous to measure the respective quantities of several hydrocarbon gases contained in the gas stream extracted from the effluent and to determine an equivalent pyrolytic carbon precursor gas content by weighting the measured quantities as a function of the number x of carbon atoms in said hydrocarbon gases, where x is such that $1<x<6$.

It is also particularly advantageous for the vector gas contained in the reaction gas admitted into the oven to come in part from the recycled gas stream. Usually, the vector gas is in volume terms a major component and often a majority component of the reaction gas, and it is therefore to be found in large quantities in the effluent gas. A large portion of the vector gas in the reaction gas can therefore be obtained by recycling, thereby achieving a significant saving in terms of consumption of vector gas coming from the external source.

The vector gas may be constituted at least in part by methane. The vector gas may also be constituted at least in part by an inert gas, e.g. selected from nitrogen, argon, helium, or a mixture of two or more thereof.

It is also possible to separate the hydrogen contained in the gas stream extracted from the effluent gas, and to control a flow rate of hydrogen as separated out in this way and recycled in the reaction gas in such a manner as to obtain a desired hydrogen content in the reaction gas admitted into the oven.

In a variant, the following steps are performed:

measuring the quantities of pyrolytic carbon precursor gas, vector gas, and hydrogen contained in the gas stream extracted from the effluent gas; and as a result of the measured quantities, controlling: the flow rate of said gas stream that is recycled in the reaction gas; the flow rate of the reagent gas coming from an external source of pyrolytic carbon precursor reagent gas and injected into the reaction gas; and the flow rate of vector gas coming from an external source of vector gas and injected into the reaction gas;

in such a manner as to obtain desired fractions of pyrolytic carbon precursor reagent gas, of vector gas, and of hydrogen in the reaction gas admitted into the oven.

At least in an initial stage of the method, it is then possible also to control a flow rate of hydrogen coming from an external hydrogen source and injected into the reaction gas.

It is known that the deposition kinetics of pyrolytic carbon can be controlled at least in part by adding hydrogen to the reaction gas. Adding hydrogen to the reaction gas slows down the kinetics of PyC deposition. Use can be made of this phenomenon to reduce the densification density gradient of substrates, in particular substrates that are very thick. Slowing down deposition kinetics increases the chances of a gas that is still rich in PyC precursor reaching the cores of substrates.

Hydrogen is produced inside the oven, by the precursor gas decomposing to produce pyrolytic carbon.

The possibly desired effect of having hydrogen present in the reaction gas can advantageously be obtained by recycling the hydrogen present in the effluent gas. An external source of hydrogen might then not be necessary, or at any rate might be necessary only during an initial stage of the method.

The effluent gas extracted from the oven is advantageously treated prior to extracting the gas stream for recycling purposes, in order to eliminate heavy hydrocarbons comprising in particular polycyclic aromatic hydrocarbons. The treatment may be performed at least in part by washing by injecting aromatic oil into a flow of effluent gas, as described in document US 2003/0101869.

Eliminating heavy hydrocarbons, in particular tars, can also be performed, at least in part, by condensation.

The treatment of the effluent gas may also include eliminating benzene hydrocarbons, which can also be performed by condensation likewise as described in document US 2003/0101869.

The invention also provides a PyC-CVI installation enabling the method to be implemented.

This object is achieved by a chemical gas infiltration installation for densifying porous substrates with pyrolytic carbon, the installation comprising an oven, a feed circuit for feeding the oven with a reaction gas, the circuit being connected to an admission inlet into the oven, an outlet for removing effluent gas from the oven, a circuit for treating and removing the effluent gas and comprising a device for eliminating heavy hydrocarbons contained in the effluent gas, and a recycling circuit connected firstly to the circuit for treating and removing effluent gas downstream from the device for eliminating heavy hydrocarbons, and secondly to the feed circuit for feeding the oven with reaction gas so as to recycle therein at least a fraction of the effluent gas.

Advantageously, the installation includes analyzer means for analyzing the content of components suitable for recycling in the effluent gas. The installation may also include a control unit connected to the analyzer means and to a plurality of valves in the feed, removal, and recycling circuits in order to control the fraction(s) of recycled effluent stream as a function of information received from the analyzer means and as a function of a composition that is desired for the reaction gas admitted into the oven.

BRIEF DESCRIPTION OF THE DRAWINGS

The invention can be better understood on reading the following description given by way of non-limiting indication with reference to the accompanying drawings, in which.

DETAILED DESCRIPTION OF EMBODIMENTS OF THE INVENTION

Figure 1:
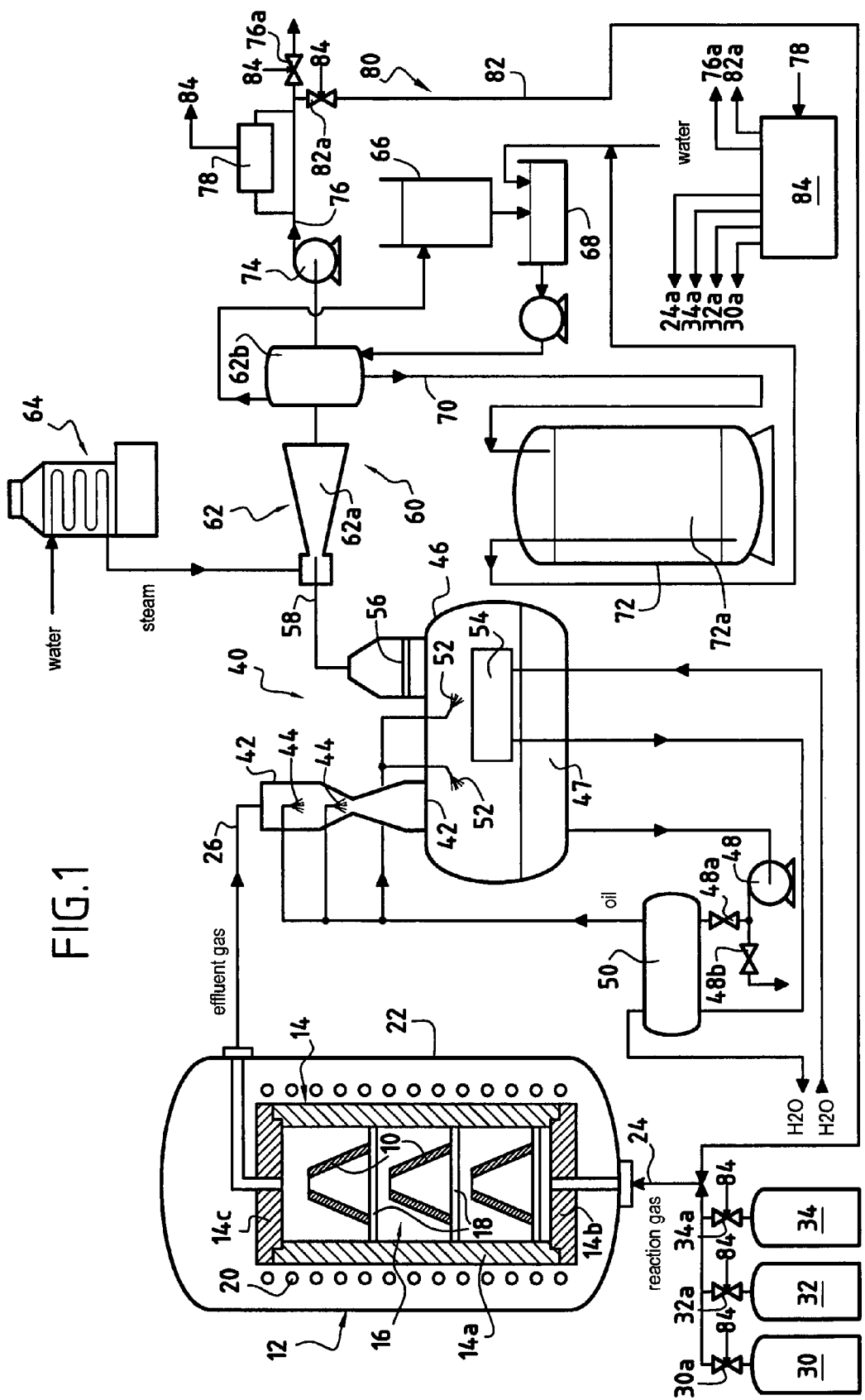
FIGS. 1 and 2 are highly diagrammatic theoretical views showing respectively in full and in part installations enabling the method in accordance with the invention to be implemented.

The installation of FIG. 1 comprises an oven 12 in which a process of densifying porous substrates with a PyC matrix obtained by CVI is performed. The oven 12 includes a graphite susceptor 14 of generally cylindrical shape about a vertical axis with a side wall 14a, a bottom 14b, and a cover 14c. Substrates 10 for densifying are placed in the chamber 16 defined by the susceptor 14. By way of example, the substrates 10 are constituted by fiber preforms of shape close to the shape of a PyC matrix composite material part that is to be made. The substrates rest, for example, on trays 18 for loading into the chamber 16.

By way of example, the oven is heated by inductive coupling between an induction coil and the side wall 14a of the susceptor. The coil 20 surrounds the wall 14a and is separated therefrom by insulation (not shown). The assembly constituted by the susceptor 14 and the coil 20 is housed in a metal casing 22.

A reaction gas is admitted into the oven via a feed pipe 24 and reaches the chamber 16 through the bottom thereof. It is possible to preheat the gas immediately before it enters into the chamber 16 by causing the gas to pass through a preheater zone, e.g. constituted by superposed perforated plates placed above the bottom 14b. The gas can thus be raised to a temperature very close to the temperature at which the PyC/CVI process is performed, which temperature is generally about 1000° C.

The effluent gas is extracted through the cover 14c and is extracted by an extractor pipe 26 connected to a vacuum source constituted by a pump device 60 serving to maintain the required low pressure inside the chamber 16.

The gas admitted into the oven comprises in particular the carbon precursor gas and the vector gas supplied by external sources 30, 32. The carbon precursor reagent gas is constituted by one or more gaseous hydrocarbons $C_xH_y$, in which x and y are integers, and x are such that $1 < x < 6$. For example, it is possible to use a source 30 of propane $C_3H_8$. The vector gas is preferably selected from nitrogen, argon, helium, and methane. By way of example, the source 30 is a source of nitrogen $N_2$.

The sources 30 and 32 are connected to the feed pipe 24 by respective pipes having valves 30a, 32a mounted therein to control the flow rate of the precursor gas and the vector gas taken from the sources 30 and 32. An additional valve may be mounted in the pipe 24 immediately upstream from the inlet to the oven 12.

An installation as described above is well known to the person skilled in the art for implementing a PyC/CVI type densification process.

The effluent gas contains reaction products in the form of hydrocarbons of smaller or greater weight, a residue of PyC precursor gas, the vector gas, and hydrogen $H_2$ derived from decomposition of the precursor gas.

After being extracted from the oven, the effluent gas is treated so as to separate therefrom at least the major portion of the heavy hydrocarbons it contains. Processes such as oil washing or condensation can eliminate such heavy hydrocarbons, such as tars, polycyclic aromatic hydrocarbons (PAH), and benzene hydrocarbons.

To eliminate PAH, it is advantageous to use a treatment device 40 of the kind described in document FR 2 832 936.

The effluent gas extracted from the oven at a temperature that is still high is admitted into the top portion of a Venturi column 42. Oil is injected into the top portion of the column 42 via one or more injectors 44. An oil is used that is capable of dissolving PAHs, in particular an aromatic type mineral oil, preferably having low vapor pressure, less than 100 pascals (Pa) at 0° C., so as to avoid vaporizing at the low pressure of the effluent gas, such as an oil based on xylenes.

The oil is taken from a tank 46 by means of a pump 48 and is cooled by passing through a heat exchanger 50 prior to feeding the injectors 44. The column 42 opens out at its bottom portion into the tank 46 so that the oil filled with dissolved PAH is collected in the tank and circulated continuously.

The effluent gas passes through the top portion of the tank 46. Additional oil injectors 52 can be provided in the tank 46 on the path of the gas, together with a condenser 54. The heat exchanger 50 and the condenser 54 have cooling water pipes passing therethrough. Valves 48a, 48b downstream from the pump 48 serve to direct the oil selectively to the injectors 44, 52 or to a drain pipe.

A droplet catcher 56, e.g. of the baffle type, contributes to breaking up a mist present at the outlet from the tank 46 by separating out the droplets and causing them to coalesce so as to collect them in the oil bath 47 occupying the bottom portion of the tank 46.

Trapping in the oil washing device 40 serves to eliminate a large amount of tar such as PAHs. Only lighter aromatic hydrocarbons (benzenes, monocyclic hydrocarbons) can remain in the washed effluent gas, however they do not run the risk of clogging pipes because their vapor pressure is higher.

The pump device 60 connected to the outlet from the droplet catcher 56 by a pipe 58 includes an ejector-condenser 62, or a plurality of similar ejector-condensers connected in series (only one being shown in the figure).

The ejector-condenser 62 comprises an ejector portion 62a fed with steam by a boiler 64, and a condenser portion 62b situated downstream from the ejector. By way of example, the condenser 62b is an indirect condenser, the gas coming from the ejector being brought into contact with pipes conveying a cooling fluid, e.g. cold water.

After passing through the condenser 62b, the water is taken to a cooling tower 66 where it can be collected in a vessel 68 into which additional water can be added in order to implement continuous circulation by a pump inserted in a pipe connecting the vessel 68 to the condenser 62b.

The condensate collected in a pipe 70 leaving the condenser contains benzene hydrocarbons (BTX) such as benzene, toluene, xylene, and possibly a PAH residue dissolved in the water coming from steam condensing in the ejector 62a. The condensate is treated by adsorption on a stationary bed 72a of active carbon contained in an adsorption column 72. The pipe 70 is connected to the top of the column 72 and the purified water collected at the bottom of the column can be taken to the vessel 68.

At the outlet from the condenser 62b, the effluent gas passes through a pump 74. It is possible to use a water ring pump cooled by a heat exchanger so that the gas extracted from the treatment installation is practically at ambient temperature.

An analyzer device 78 is mounted in parallel with the outlet pipe 76 from the pump 74 to analyze the composition of the gas extracted by the pump 74, in particular to determine the respective quantities of PyC precursor gas, of vector gas, and of hydrogen $H_2$. The precursor gas contained in the effluent gas comprises a residue of reagent precursor gas admitted into the inlet of the oven 12 together with reaction products in the $C_xH_y$ form, where x and y are integers. By way of example, the analyzer device 78 is a mass spectrometer, or a gas chromatograph, or both, or indeed any other known analyzer means.

A recycling circuit 80 serves to recycle a fraction of the effluent gas that has been cleared of heavy hydrocarbons into the reaction gas that is admitted into the oven. For this purpose, a recycling pipe 82 branches from the pipe 76 downstream from the analyzer device 78. Valves 82a, 76a serve to control the flow rate of the recycled gas admitted into the pipe 82 and the flow rate of the gas exhausted by the pipe 76 to a flare and/or a device for feeding the boiler 64 with fuel gas.

The effluent gas fraction extracted by the pipe 82 is taken to the pipe 24 for feeding the oven with gas.

The gas then contains the PyC precursor reagent gas, the vector gas, and hydrogen $H_2$.

As mentioned above, the presence of $H_2$ has the effect of slowing down the kinetics of PyC deposition and contributes to reducing the densification gradient of porous substrates between the cores and the outer portions thereof. After an initial stage of densification with slow deposition kinetics, the kinetics can be increased by raising the temperature and/or the pressure in the oven and/or by increasing the doping density (the proportion of precursor gas). A same total duration for densification, or even a shorter duration, can then suffice to achieve a degree of densification substantially equal to that obtained without adding $H_2$, but with a smaller densification gradient. It is also possible to vary the flow rate of $H_2$ while the CVI process is taking place.

The quantity of hydrogen desired in the reaction gas is provided in this example by recycling a fraction of the effluent gas. Nevertheless, when starting the CVI process, it can be necessary to supply external $H_2$. An external source 34 of $H_2$ is then provided connected to the feed pipe 34 by a pipe having a valve 34a mounted therein.

To evaluate the carbon precursor gas content in the effluent gas fraction taken by the recycling pipe 82, account is taken of the quantities of $C_xH_y$ hydrocarbon present, as measured by the analyzer device 78 so that $1<x<6$. The quantities measured for each $C_xH_y$ hydrocarbon are weighted by a multiplier coefficient equal to x. It is then possible to determine a precursor gas content that is "equivalent" to a precursor gas content delivered by the external source, in this case $C_3H_8$. The information provided by the analyzer device 78 is transmitted to a controller or control unit 84 that serves in particular to evaluate the $C_3H_8$ equivalent content of precursor reagent gas in the effluent gas.

For a desired composition and flow rate of reaction gas admitted into the oven, in particular for obtaining PyC having a particular microstructure, the control device 84 controls the valves 30a, 32a, 34a, 76a, and 82a so as to obtain said desired composition and flow rate as a function of the information provided by the analyzer device 78. Naturally, the composition and the flow rate of the reaction gas can be varied while the CVI process is taking place.

For example, it is possible to set the valves 76a, 82a, and 34a initially so as to have the desired quantity of $H_2$, it being understood that recycling is preferred for this purpose, with the source 34 being used only while the quantity of $H_2$ in the effluent gas is insufficient, in particular at the beginning of the process. With the valve 82a being controlled, the quantities of precursor reagent gas and of vector gas in the recycled gas are known. These quantities are necessarily less than those present at the inlet to the oven since precursor gas is consumed and vector gas is inevitably lost, so the valves 30a and 32a are controlled to provide the necessary additional amounts.

Figure 2:
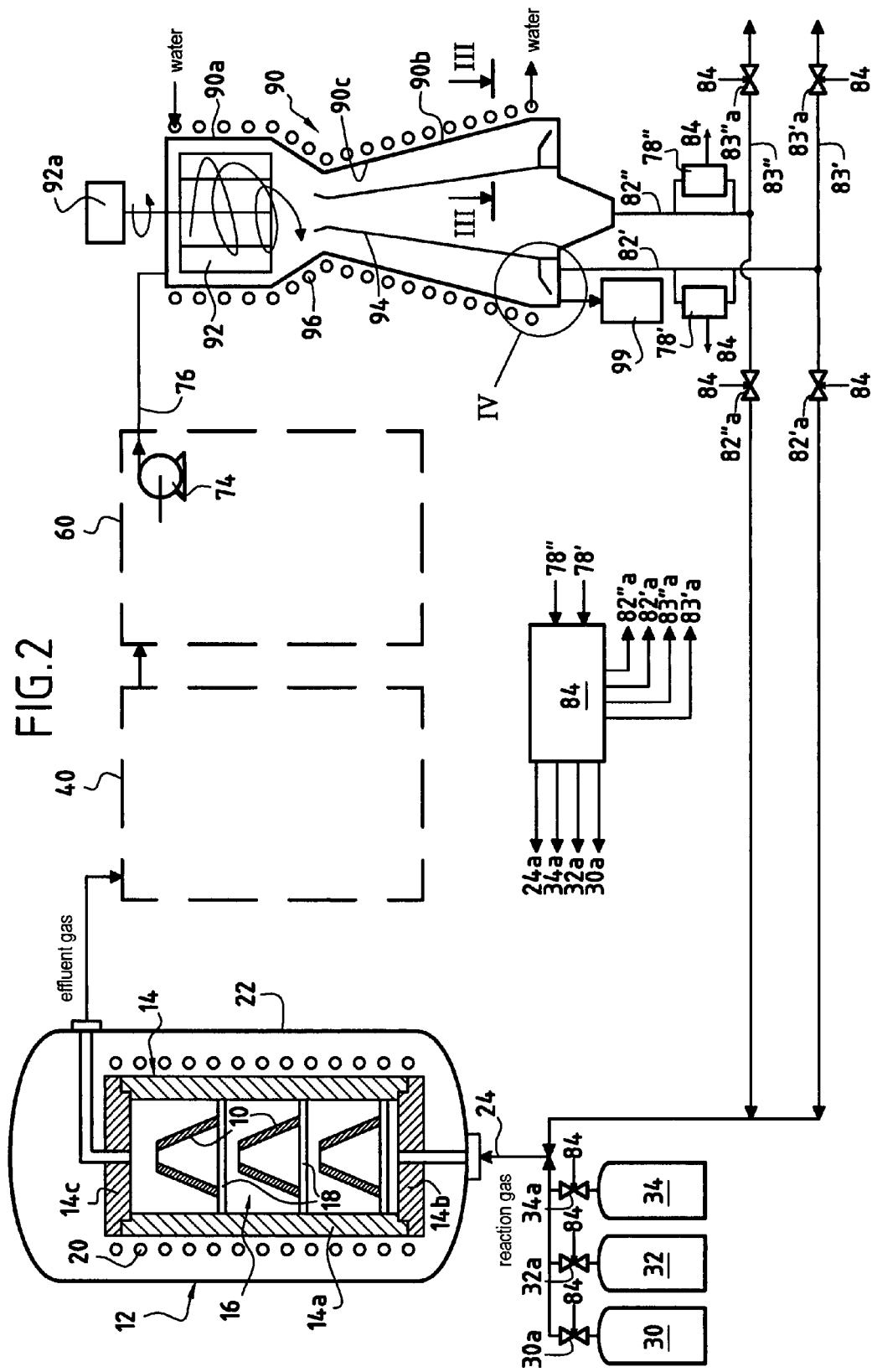

FIG. 2 shows a variant embodiment in which the effluent gas is treated so as to separate $H_2$ therefrom. The elements in common to the embodiments of FIGS. 1 and 2 are given the same reference numbers. The washing and pumping devices 40 and 60 of the FIG. 2 installation are identical to those of FIG. 1 and they are not shown in detail.

A separator 90 is mounted on the pipe 76 at the outlet from the pump 74. The separator 90 is of known type having a rotary cage serving to separate gaseous species having different molecular masses by making use of centrifugal force. The separator 90 is generally in the form of a Venturi column with a cylindrical top portion 90a of substantially circular section connected via a throat of small section to a frustoconical bottom portion 90b that flares downwards. The recycled fraction is admitted via the pipe 76 to the top portion of the separator in which the rotary cage 92 is housed and is driven in rotation about the vertical axis of the separator by a motor 92a.

The gas admitted into the separator is thus caused to rotate. The heavier gas components collects in the vicinity of the inside wall 90c of the separator while the lighter components remain in the central portion. A frustoconical stationary wall 94 can be placed in the bottom portion of the separator to prevent mixing between the components that have been separated by centrifugal force.

Figure 3:
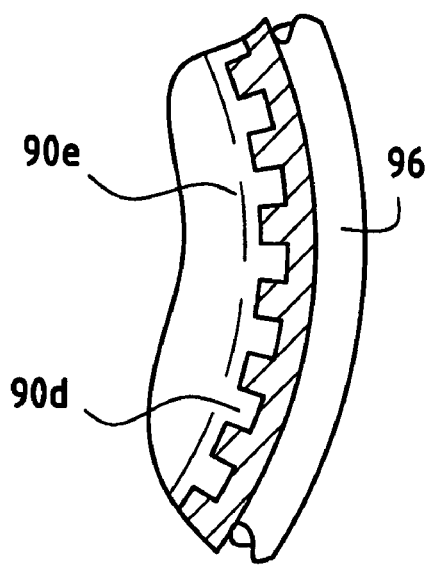
FIGS. 3 and 4 show details of the separator in the FIG. 2 installation on a larger scale, FIG. 3 being a fragmentary section view on plane III-III of FIG. 2.
Figure 4:
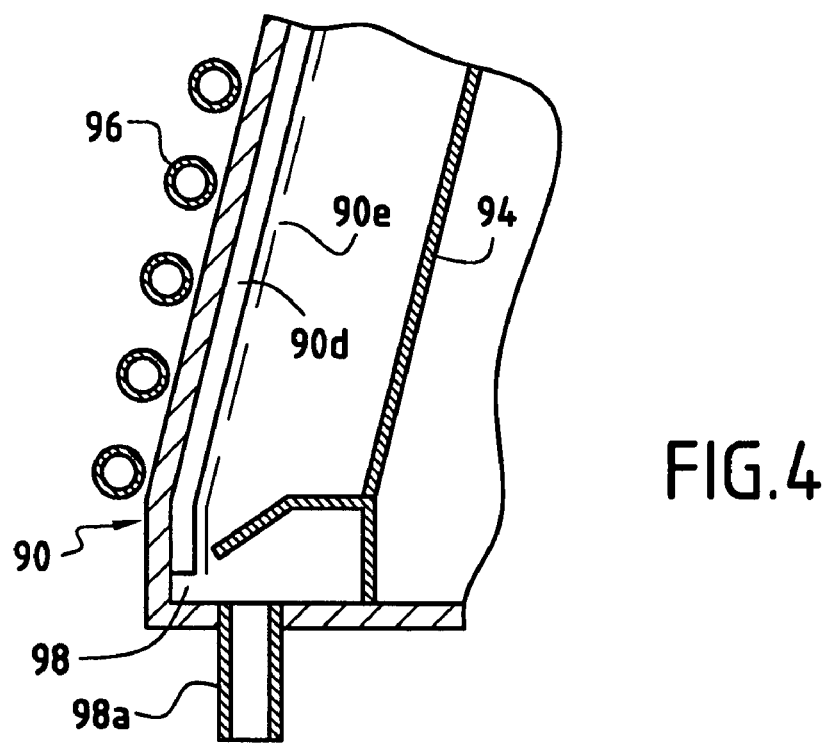

The wall of the separator is cooled by a flow of cooling water in a helical pipe 96 in contact with the outside face of said wall. The heavier species coming into contact with the wall of the separator can thus be condensed. On the inside, the wall of the separator may present grooves 90d, possibly in a spiral configuration extending downwards, and it may be provided with a capillary capture grid 90e, as shown in FIG. 3. Thus, the condensed species captured by the grid 90e can flow along the grooves 90d to the bottom of the separator when they can be collected in an annular gutter 98 (FIG. 4) from which they can be taken by a drain pipe 98a for collection in a vessel 99.

Light hydrocarbons, constituting PyC precursor reagent gas, are collected at the base of the separator 90, on the outside of the wall 94, via a pipe 82'. A removal pipe 83' branches from the pipe 82' to remove the non-recycled fraction of the stream collected by the pipe 82' to a flare and/or to a device for feeding fuel gas to the boiler that produces the stream for the ejector-condenser of the pump device 60.

A gas essentially containing hydrogen gas $H_2$ is collected from the base of the separator 90, from the central portion thereof, on the inside of the wall 94, via a pipe 82". A removal pipe 83" branches from the pipe 82" to remove the non-recycled fraction of the stream connected by the pipe 82", e.g. to a torch.

Vector gas may be present in the pipe 82' and/or in the pipe 82".

Valves 82'a, 82"a, 83'a, 83"a are mounted in the pipe 82, 82", 83', and 83", and are controlled by the control unit 84.

Analyzer devices 78', 78" are connected in parallel with the pipes 82', 82" immediately after the outlet from the separator 90 so as to measure the quantities of PyC precursor reagent gas and of vector gas that are traveling in the pipe 82', and also the quantities of hydrogen gas $H_2$ and possibly also vector gas that are traveling in the pipe 82". The analyzer devices 78' and 78" are connected upstream from the valves 82'a and 82"a. The information collected by the analyzer devices 78', 78" is transmitted to the control unit 84. There is no need to provide an analyzer device in parallel with the pipe 76.

The installation shown in FIG. 2 makes it possible to implement a PyC/CVI process without it being necessary to introduce $H_2$ gas into the reaction gas. It suffices for this purpose to make no use of an external source of $H_2$ and to control the valves 82"a and 83"a to as to remove all of the gas taken from the central axial portion of the separator 90. Under such circumstances, the control device 84 is programmed to feed the oven 10 with gas having the desired content of precursor reagent gas relative to the vector gas and a desired total flow rate, and to control the valves 30a, 32a, 82a, 82'a, and 83'a, accordingly. It is then possible to privilege recycling as great as possible a quantity of precursor gas and vector gas.

The installation of FIG. 2 clearly also makes it possible to perform a PyC/CVI process in which the reaction gas contains $H_2$. The respective proportions desired for the PyC precursor reagent gas, for the vector gas, and for $H_2$ are obtained, as is the total flow rate of the gas, by controlling the various valves of the external feed circuit and of the recycling feed circuit.

Recycling a fraction of the effluent gas is advantageously performed after heavy hydrocarbons such as PAHs have been eliminated, and also advantageously after benzene hydrocarbons have been eliminated. Elimination can be performed by means other than those described above, for example by using one or more condensers in series with the effluent gas being cooled progressively.

The invention claimed is:

1. A chemical vapor infiltration method for densifying porous substrates with pyrolytic carbon, the method comprising the steps of:
    loading one or more porous substrates for densifying in an oven;
    admitting into the oven a reaction gas containing a pyrolytic carbon precursor reagent gas having at least one gaseous hydrocarbon $C_xH_y$ in which x and y are natural integers and x is such that 1<x<6, together with a vector gas comprising at least one gas selected from methane and inert gases;
    extracting from the oven an effluent gas containing residual components of the admitted gas and reaction products, including hydrogen; and
    extracting from the effluent gas a gas stream containing residual pyrolytic carbon precursor reagent gas and vector gas for recycling at least a fraction of said gas stream into the reaction gas admitted into the oven;
    measuring at least the quantities of pyrolytic carbon precursor gas and of vector gas contained in said gas stream extracted from the effluent gas; and
    as a function of the measured quantities, controlling at least: the flow rate of said gas stream that is recycled into the reaction gas and that contains pyrocarbon precursor reagent gas and vector gas; the flow rate of precursor gas coming from an external source of pyrolytic carbon precursor gas and injected into the reaction gas; and the flow rate of vector gas coming from an external source of vector gas and injected into the reaction gas; wherein said controlling is performed in such a manner as to obtain a desired fraction of pyrolytic carbon precursor gas in the reaction gas admitted into the oven.

2. A method according to claim 1, further comprising separating out hydrogen contained in the gas stream extracted from the effluent gas, and controlling a flow rate of hydrogen as separated out in this way which is recycled in the reaction gas in such a manner as to obtain a desired hydrogen content in the reaction gas admitted into the oven.

3. A method according to claim 2, characterized in that, at least during an initial stage of the method, the flow rate of hydrogen coming from an external source of hydrogen and injected into the reaction gas is also controlled.

4. A method according to claim 2, characterized in that the respective quantities of a plurality of hydrocarbon gases contained in the gas stream extracted from the effluent gas are measured and an equivalent content of pyrolytic carbon precursor gas is determined by weighting the measured quantities as a function of the number x of carbon atoms in said hydrocarbon gases.

5. A method according to claim 4, characterized in that account is taken of those $C_xH_y$ hydrocarbon gases for which $1<x<6$.

6. A method according to claim 5, characterized in that
the vector gas comprises methane;
the vector gas comprises an inert gas selected from the group consisting of nitrogen, argon, helium, and a mixture of two or more thereof;
the effluent gas removed from the oven is treated prior to extracting the gas stream for recycling, so as to eliminate heavy hydrocarbons comprising polycyclic aromatic hydrocarbons;
polycyclic aromatic hydrocarbons are eliminated by washing by injecting aromatic oil into a flow of effluent gas;
heavy hydrocarbons are eliminated at least in part by condensation;
the treatment of the effluent gas includes eliminating benzene hydrocarbons.

7. A method according to claim 1, characterized by:
measuring the quantities of pyrolytic carbon precursor gas, vector gas, and hydrogen contained in the gas stream extracted from the effluent gas; and
as a result of the measured quantities, controlling: the flow rate of said gas stream that is recycled in the reaction gas; the flow rate of the reagent gas coming from an external source of pyrolytic carbon precursor reagent gas and injected into the reaction gas; and the flow rate of vector gas coming from an external source of vector gas and injected into the reaction gas; wherein said controlling is performed in such a manner as to obtain desired fractions of pyrolytic carbon precursor reagent gas, of vector gas, and of hydrogen in the reaction gas admitted into the oven.

8. A method according to claim 7, characterized in that, at least during an initial stage of the method, the flow rate of hydrogen coming from an external source of hydrogen and injected into the reaction gas is also controlled.

9. A method according to claim 1, characterized in that the respective quantities of a plurality of hydrocarbon gases contained in the gas stream extracted from the effluent gas are measured and an equivalent content of pyrolytic carbon precursor gas is determined by weighting the measured quantities as a function of the number x of carbon atoms in said hydrocarbon gases.

10. A method according to claim 9, characterized in that account is taken of those $C_xH_y$ hydrocarbon gases for which $1<x<6$.

11. A method according to claim 10, characterized in that the respective quantities of a plurality of hydrocarbon gases contained in the gas stream extracted from the effluent gas are measured and an equivalent content of pyrolytic carbon precursor gas is determined by weighting the measured quantities as a function of the number x of carbon atoms in said hydrocarbon gases.

12. A method according to claim 11, characterized in that account is taken of those $C_xH_y$ hydrocarbon gases for which $1<x<6$.

13. A method according to claim 12, characterized in that
the vector gas comprises methane;
the vector gas comprises an inert gas selected from the group consisting of nitrogen, argon, helium, and a mixture of two or more thereof;
the effluent gas removed from the oven is treated prior to extracting the gas stream for recycling, so as to eliminate heavy hydrocarbons comprising in particular polycyclic aromatic hydrocarbons;
polycyclic aromatic hydrocarbons are eliminated by washing by injecting aromatic oil into a flow of effluent gas;
heavy hydrocarbons are eliminated at least in part by condensation;
the treatment of the effluent gas includes eliminating benzene hydrocarbons.

14. A method according to claim 1, characterized in that the vector gas comprising methane.

15. A method according to claim 1, characterized in that the vector gas comprises an inert gas selected from the group of consisting of nitrogen, argon, helium, and a mixture of two or more thereof.

16. A method according to claim 1, characterized in that the effluent gas removed from the oven is treated prior to extracting the gas stream for recycling, so as to eliminate heavy hydrocarbons comprising in particular polycyclic aromatic hydrocarbons.

17. A method according to claim 16, characterized in that polycyclic aromatic hydrocarbons are eliminated by washing by injecting aromatic oil into a flow of effluent gas.

18. A method according to claim 16, characterized in that heavy hydrocarbons are eliminated at least in part by condensation.

19. A method according to claim 16, characterized in that the treatment of the effluent gas includes eliminating benzene hydrocarbons.

* * * * *